(12) United States Patent
Takeuchi et al.

(10) Patent No.: US 6,310,507 B1
(45) Date of Patent: Oct. 30, 2001

(54) TIMING GENERATION CIRCUIT FOR ELECTRO-OPTIC SAMPLING OSCILLOSCOPE

(75) Inventors: Nobuaki Takeuchi; Yoshiki Yanagisawa; Jun Kikuchi; Yoshio Endou; Mitsuru Shinagawa; Tadao Nagatsuma; Kazuyoshi Matsuhiro, all of Tokyo (JP)

(73) Assignees: Ando Electric Co., Ltd.; Nippon Telegraph and Telephone Corp., both of Tokyo (JP)

( * ) Notice: Subject to any disclaimer, the term of this patent is extended or adjusted under 35 U.S.C. 154(b) by 0 days.

(21) Appl. No.: 09/167,303

(22) Filed: Oct. 6, 1998

(30) Foreign Application Priority Data

Oct. 6, 1997 (JP) .................................................... 9-273156

(51) Int. Cl.[7] ...................................................... G06F 1/04
(52) U.S. Cl. ............................. 327/291; 327/93; 327/115; 327/117; 327/162; 375/362
(58) Field of Search .................................. 327/91, 93, 94, 327/113, 115, 117, 136, 39, 44, 46–48, 165, 162, 291, 292, 297; 702/79, 57; 377/47, 48; 375/362, 364; 326/93; 324/121 R

(56) References Cited

U.S. PATENT DOCUMENTS

5,914,592 * 6/1999 Saito ................................. 324/121 R

OTHER PUBLICATIONS

"A High–Impedance Probe Based on Eelctro–Optic Sampling" Proceeding of the 15th Meeting on Lightwave Technology, May 1995, pp 123–129.

* cited by examiner

Primary Examiner—Timothy P. Callahan
Assistant Examiner—Minh Nguyen
(74) Attorney, Agent, or Firm—Darby & Darby

(57) ABSTRACT

The present invention relates to an electro-optic sampling oscilloscope which carries out measurement of a measured signal using an optical pulse generated based on a timing signal from a timing generation circuit. The timing generation circuit includes a frequency measurement circuit which generates a gate signal for a gate interval which is a specified multiple N of the cycle of the desired sampling rate, and counts the input trigger signals during the gate interval of the gate signal; a division circuit which divides the count value of said frequency measurement circuit by the specified multiple N, and determines a divider ratio; and a frequency divider which divides the trigger signals by the divider ratio determined by the division circuit, and outputs the result as the timing signal.

9 Claims, 12 Drawing Sheets

FIG. 7

| TRIGGER INPUT FREQUENCY | | DIVIDER RATIO (a2) | GATE TIME (32 μs) COUNT NUMBER (a1) | |
|---|---|---|---|---|
| FREQUENCY UP | FREQUENCY DOWN | | FREQUENCY DOWN | FREQUENCY UP |
| DC → 495MHz | DC → 500MHz | 1 | 495 OR LESS | 500 OR LESS |
| → 990MHz | → 1GHz | 2 | 496 – 990 | 501 – 1000 |
| → 1.98GHz | → 2GHz | 4 | 991 – 1980 | 1001 – 2000 |
| → 3.96GHz | → 4GHz | 8 | 1981 – 3960 | 2001 – 4000 |
| → 7.92GHz | → 8GHz | 16 | 3961 – 7920 | 4001 – 8000 |
| 10GHz → 14.4GHz | → 16GHz | 32 | 7921 ～ | 8001 |

(a3) (b3) (b4) (b1) (b2)

FIG. 8
(a) DIVIDER RATIO DETERMINED BY THE DIVIDER RATIO DETERMINATION MEANS
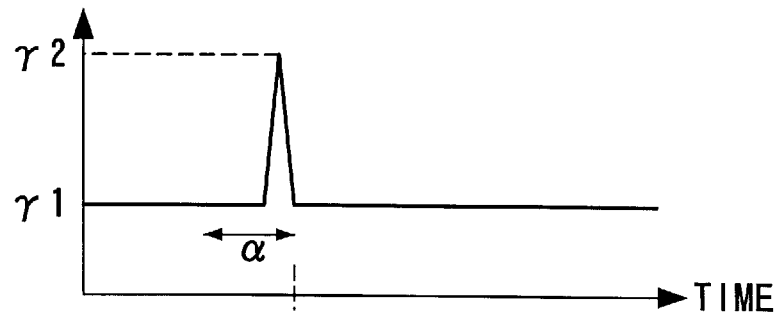
(b) DIVIDER RATIO DETERMINED BY THE DIVIDER RATIO COMPENSATION MEANS
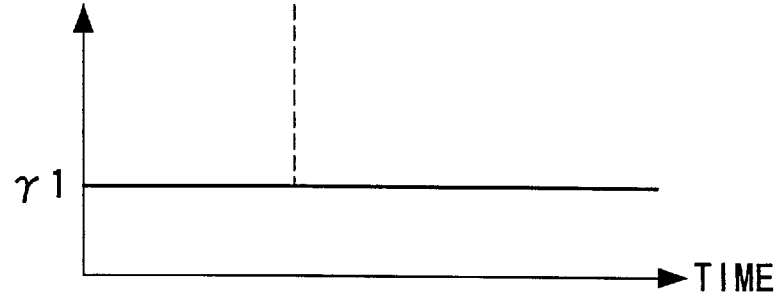
(c) DIVIDER RATIO DETERMINED BY THE DIVIDER RATIO DETERMINATION MEANS
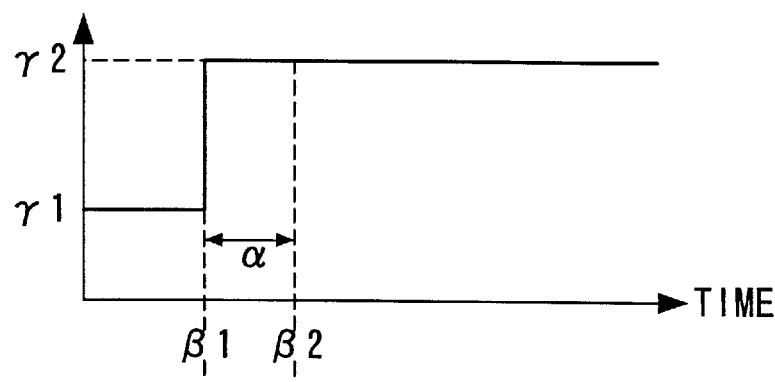
(d) DIVIDER RATIO DETERMINED BY THE DIVIDER RATIO COMPENSATION MEANS
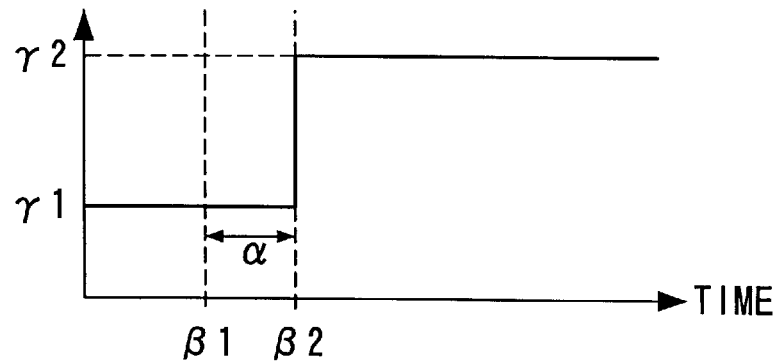

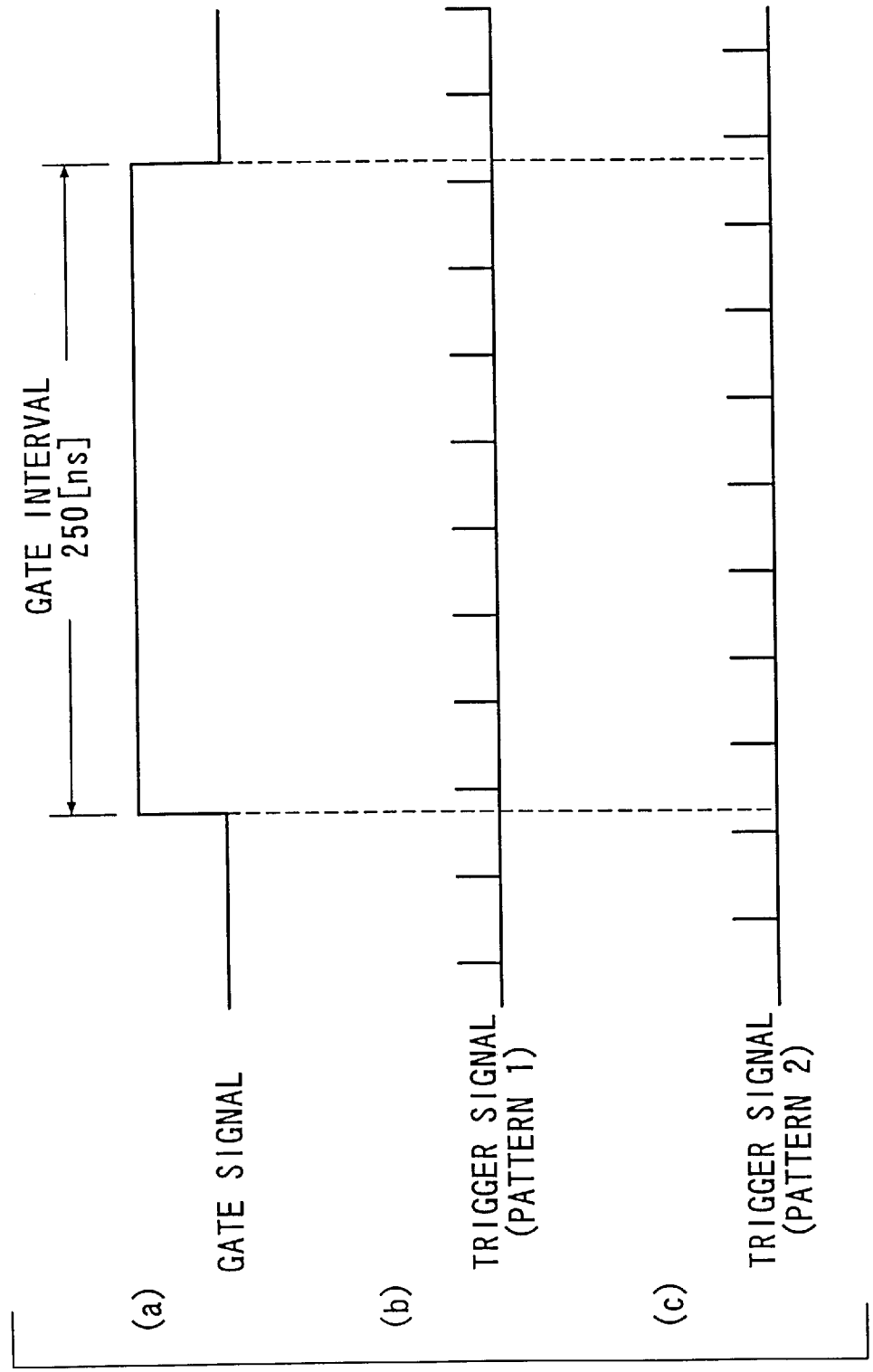

TIMING GENERATION CIRCUIT FOR ELECTRO-OPTIC SAMPLING OSCILLOSCOPE

BACKGROUND OF THE INVENTION

1. Field of the Invention

The present invention relates to an electro-optic sampling oscilloscope in which an electrical field generated by a measured signal is coupled to an electro-optic crystal. An optical pulse which is generated based on a timing signal from a timing generation circuit is input into this electro-optic crystal, and the waveform of the measured signal is measured by the state of the polarization of the input optical pulse. The present invention relates in particular to an electro-optic sampling oscilloscope characterized in the timing generation circuit which generates a timing signal.

This application is based on patent application No.Hei 9-237156 filed in Japan, the content of which is incorporated herein by reference.

2. Background Art

It is possible to observe the waveform of a signal to be measured by coupling the electric field generated by the signal to be measured to an electro-optic crystal, causing laser light to enter this electro-optic crystal, and using the polarization state of the laser light. Here, it is possible to use this laser light in pulse form, and to conduct measurements with extremely high time resolution when the sampling of the signal to be measured is conducted. An electro-optic sampling oscilloscope employs an electro-optic probe which takes advantage of this phenomenon.

In comparison with conventional sampling oscilloscopes which employ electrical probes, such an electro-optic sampling oscilloscope (herein below termed an "EOS" oscilloscope) has the following characteristic features:

(1) When signals are measured, a ground wire is not required, so that measurement is simplified.
(2) The metal pin which is at the lead end of the electro-optic probe is isolated from the circuit system, so that it is possible to realize a high input impedance, and as a result, the state at the point at which measurement is conducted is essentially free of fluctuations.
(3) Since optical pulses are employed, measurement is possible in a broad band up to the order of GHz.

FIG. 10 serves to explain the measurement concept of the electro-optic probe in an EOS oscilloscope.

As shown in FIG. 10, a metal pin 21 is provided at the lead end of the electro-optic probe, and by placing this in contact with the signal line 31 which is the subject of measurement, an electric field 23 is generated based on the measured signal. In order to couple the electric field generated with an electro-optic crystal 22, the electro-optic crystal 22 is provided at the end of the metal pin 21. With respect to this electro-optic crystal 22, as a result of Pockels effect, which is a primary electro-optical effect, the index of refraction of the electro-optic crystal changes in accordance with the coupled electric field strength, so that when an optical pulse 25 is inputted in this state, the polarization state of the optical pulse changes. The optical pulse 25 which experiences a change in polarization is reflected by reflection mirror 24, which is a multi-layered dielectric film mirror, and is guided to the light receiver 26, which serves as the input part of the polarization detecting optical system within the electro-optic probe (Shinagawa, et al: ""A High-Impedance Probe Based on Electo-Optic Sampling," Proceeding of the 15$^{th}$ Meeting on Lightwave Sensing Technology, May 1995, pp 123–129).

Next, the structure of the EOS oscilloscope will be explained using FIG. 11.

In FIG. 11, the EOS oscilloscope is constructed from an EOS oscilloscope main body 1 and an electro-optic probe 2.

In FIG. 11, the EOS oscilloscope main body 1 is formed from a trigger circuit 3, a timing generation circuit 4, an optical pulse generation circuit 5, an A/D converter 6, a processing circuit 7, and a setting unit 8.

Here, the trigger circuit 3 generates the trigger signals of a frequency set by the setting unit 8. In addition, the timing generation circuit 4 generates timing signals for A/D conversion in the A/D converter 6. Moreover, these timing signals are generated by using as input signals which are the desired sampling rate, trigger signals from the trigger circuit 3, and a clock signal from an internal clock. Here, the desired sampling rate means the sampling rate determined by the processing circuit 7 based on the x-axis scale which is the rate of expansion in the time direction of the measuring signal set by the setting unit 8.

The optical pulse generation circuit 5 generates an optical pulse based on the signal from the timing generation circuit 4, and supplies it to the electro-optic probe 2. Then the polarized optical pulse is detected it's polarization determined by the polarization detection optical system (not shown) in the electro-optic probe 2, and this signal is input into the EOS oscilloscope main body 1. This signal is amplified and A/D converted by the A/D converter 6. Then, the A/D converted signal is processed by the processing circuit 7 to be displayed, etc., as the signal which is the object of measurement.

FIG. 12 shows in more detail the timing generation circuit 4 in FIG. 11. Moreover, this timing generation circuit 4 is used when the frequency of the trigger signals from the trigger circuit are higher than the desired sampling rate determined by the processing circuit 7. In this type of case, in the timing generation circuit 4, the divider ratio determination circuit 81 uses an internal clock of known oscillation frequency to generate a gate signal which is the cycle of the desired sampling rate, and counts the trigger signals input during the gate interval of this gate signal. For example, if the desired sampling rate is 4 [MHz] (a 250 [nS] period) and the trigger signals are 32 [MHz], a gate signal of 250 [nS] is generated using the internal clock, and when these trigger signals are counted during this interval, the count number is [8]. Next, the divider ratio determination circuit 81 uses this count value as the divider ratio, and sends this counted value to the frequency divider 82.

The frequency divider 82 which receives the divider ratio divides the trigger signals by this divider ratio, and outputs the result as the timing signal. In the example described above, the 32 [MHz] gate signal is divided by the divider ratio of [8], and thus the timing signal of 4 [MHz], which is the desired sampling rate, is output.

However, the gate signal input to the timing generation circuit 4 in the above described EOS oscilloscope and internal clock are asynchronous. Because of this, as shown in part (a) in FIG. 13, even if the gate signal of 250 [nS], which is the period of the desired sampling rate, is generated by the internal clock, because of the difference of the oscillation timing between the internal clock and the trigger signal, the count number of the trigger signals in the divider ratio determination circuit 81, as shown in part (b) in FIG. 13, is sometimes "8", and as shown in part (c) in FIG. 13, sometimes "7". That is, an error of ±1 is produced, and a timing signal different from the desired sampling rate is generated. As a result, the precision of the signal measurement using an EOS oscilloscope deteriorates.

SUMMARY OF THE INVENTION

In consideration of the above situation, it is the object of the present invention to provide an electro-optic sampling oscilloscope which precisely generates the timing signals that give the desired sampling rate, and can increase the precision of the signal measurement of the measured circuit.

Therefore, the invention provides an electro-optic sampling oscilloscope having a timing generation circuit of which generates a gate signal of a specified multiple N of the cycle of the desired sampling rate, counts the input trigger signals during the gate interval of said gate signal, and divides the count value by said specified multiple N, and determines a divider ratio.

In this manner, a divider ratio can be determined at a precision of (1/specified multiple), and a timing signal which gives a precise desired sampling rate can be generated.

Furthermore, the invention provides an electro-optic sampling oscilloscope having a timing generation circuit which comprises a pre-counter and a counter. And the pre-counter generates a gate signal of a specified multiple N of the cycle of the specified frequency, counts the input trigger signals during the gate interval of the gate signal, divides this count value by the specified multiple N, and determines a divider ratio. In addition, the counter generates a gate signal which is a specific multiple M of the cycle of the desired sampling rate, counts the signals input from the pre-counter during the gate interval of the gate signal, divides the count value by the specified multiplier M, and determines a divider ratio.

In this manner, the divider ratio can be determined to a precision of (1/specific multiple), and can generate a timing signal which gives the precise desired sampling rate. Furthermore, in this manner a timing generation circuit can be structured from the pre-counter and the counter which have differing corresponding frequencies, and it is possible to reduce the parts cost of the timing generation circuit as a whole.

Furthermore, the invention provides an electro-optic sampling oscilloscope having a timing generation circuit which generates a gate signal according to the desired sampling rate, and counts the input trigger signals during the gate interval of the gate signal, and determines the divider ratio from the count value by providing digital hysteresis.

In this manner, in the frequency of each frequency ratio region, even when the trigger signal has jitter, it is possible to achieve a stable output, and outputs the result as a timing signal.

Furthermore, the invention provides an electro-optic sampling oscilloscope having a timing generation circuit of an electro-optic sampling oscilloscope which comprises a pre-counter and a counter. And the pre-counter generates a gate signal depending on said specified frequency, counts the input trigger signals during the gate interval of said gate signal, and determines the divider ratio from the count value by providing digital hysteresis.

In this manner, in the frequency of each frequency region, even if there is jitter in the trigger signals, it is possible to achieve a stable output. Furthermore, in this manner it is possible to structure the timing generation circuit from the pre-counter and the counter with differing corresponding frequencies, and it is possible to reduce the cost of parts of the timing generation circuit as a whole.

This summary of the invention dose not necessarily describes all necessary features so that the invention may also be a sub-combination of these described features.

The reference symbols used in the claims are not any influences for the interpretation of the claims. (only for EP application)

BRIEF DESCRIPTION OF THE DRAWINGS

FIG. 7 shows the relation between the trigger input frequency, the count number of the gate interval, and the divider ratio.

FIG. 8 explains the divider ratio compensation means in FIG. 6.

FIG. 13 explains the divider ratio error.

DETAILED DESCRIPTION OF THE PREFERRED EMBODIMENTS

The following embodiments do not restrict the interpretation of the claims relating to the present invention, and the combination of all the features explained in the embodiments is always not being indispensable means of solving the problem.

Below, the electro-optic sampling oscilloscope according to the embodiments of the present invention will be explained referring to the figures.

[First Embodiment]

Figure 11:
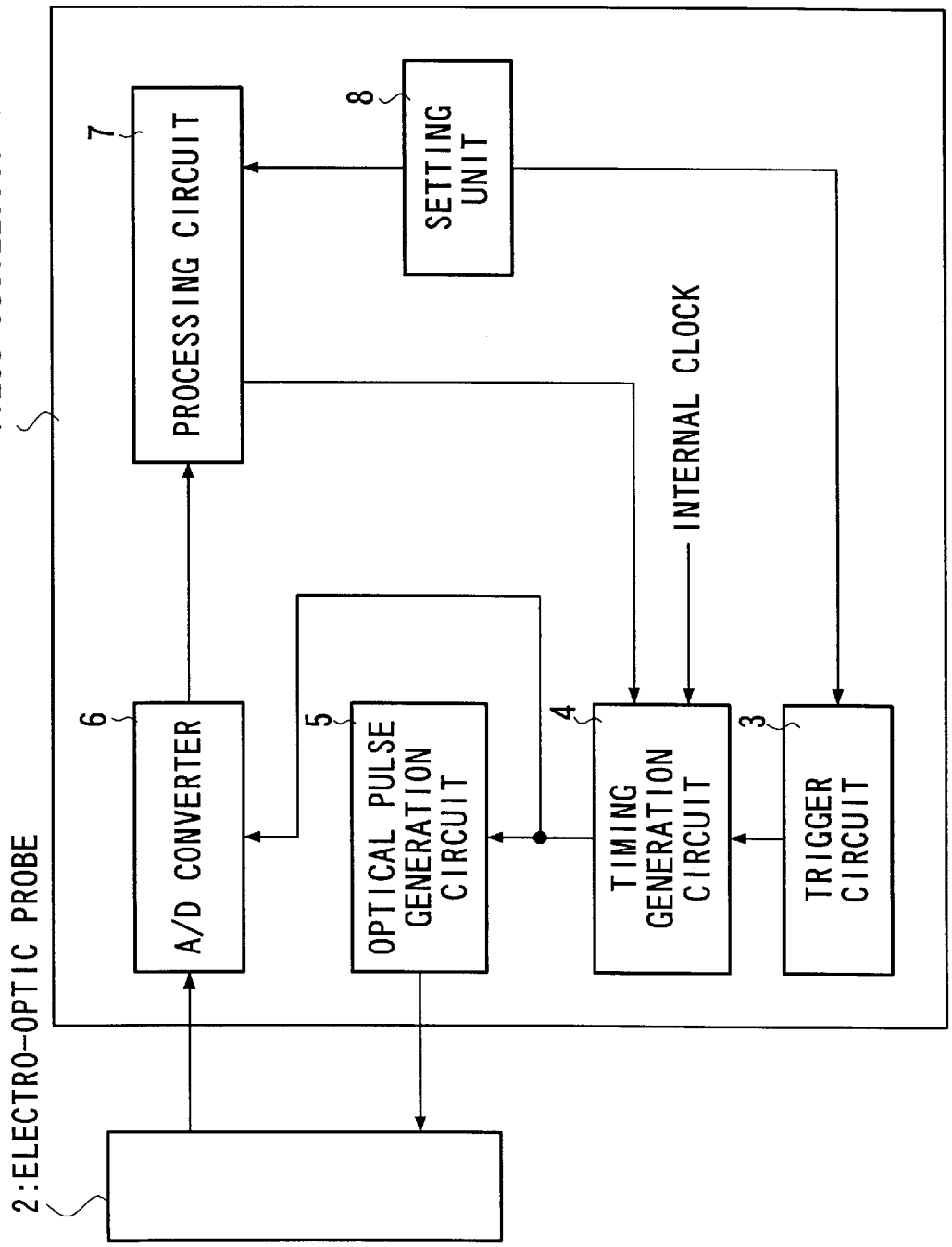
FIG. 11 shows an example of the structure of the EOS oscilloscope.
Figure 12:
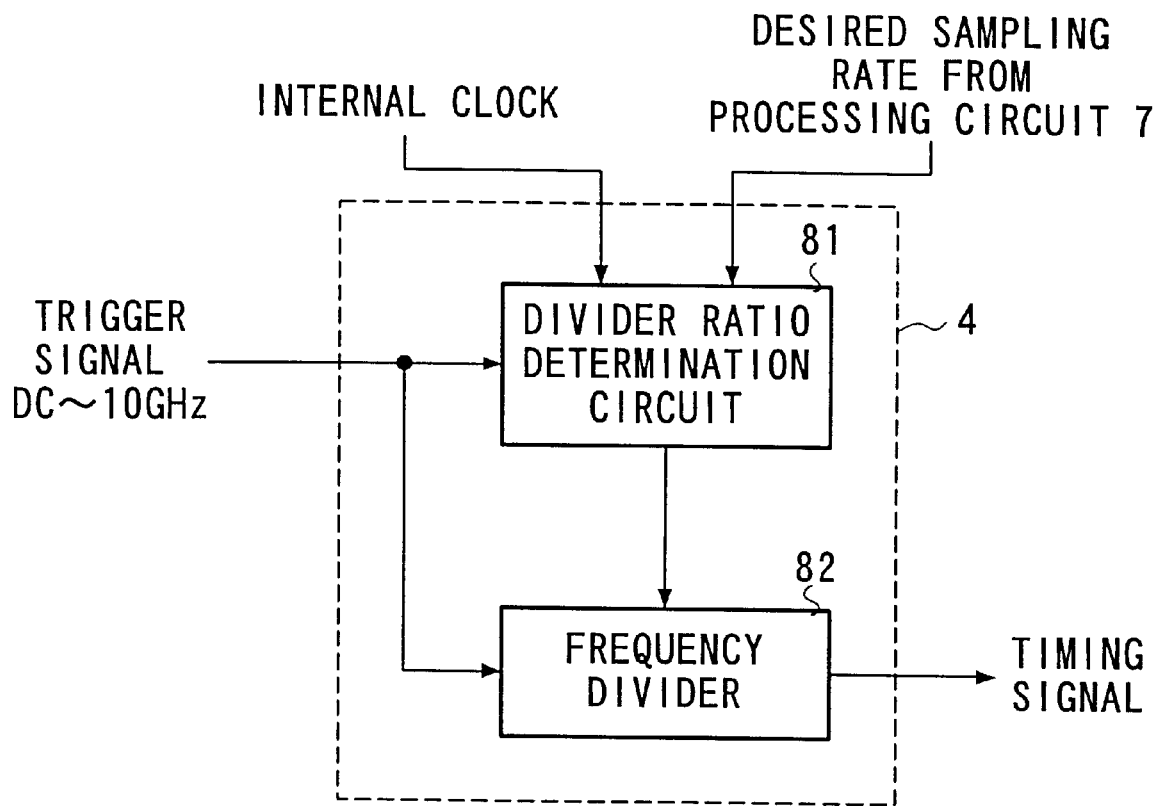
FIG. 12 shows an example of a conventional structure of a timing generation circuit of an EOS oscilloscope.

FIG. 11 shows an example of the structure of the EOS oscilloscope. As described above, an EOS oscilloscope comprises an EOS oscilloscope main body 1 and an electro-optic probe 2. In addition, the EOS oscilloscope main body of comprises a trigger circuit 3, a timing generation circuit 4, a optical pulse generation circuit 5, an A/D converter 6, a processing circuit 7, and a setting unit 8.

Here, the trigger circuit 3 generates trigger signals at a frequency determined by the user with the setting unit 8. Additionally, the timing generation circuit 4 generates a timing signal for optical pulse generation timing and A/D conversion timing in the A/D converter 6. Moreover, this timing signal is generated using as input signals which give the desired sampling rate, the trigger signals from the trigger circuit 3, and the clock signal from the internal clock. Further, this desired sampling rate is calculated using a desired sampling rate table for an x-axis scale set by the setting unit 8, or is calculated based on a calculation from an x-axis scale.

In addition, based on the signal from the timing generation circuit 4, a optical pulse generation circuit 5 generates a optical pulse and supplies it to the electro-optic probe 2. Then, the polarized optical pulse is detected it's polarization by a polarization detection optical system (not shown) in the electro-optic probe 2, and this signal is input into the electro-optic sampling oscilloscope main body 1. This signal is amplified and A/D converted in the A/D converter 6, and the signal which is the object of measurement is processed for display, etc., by the processing circuit 7.

Figure 1:
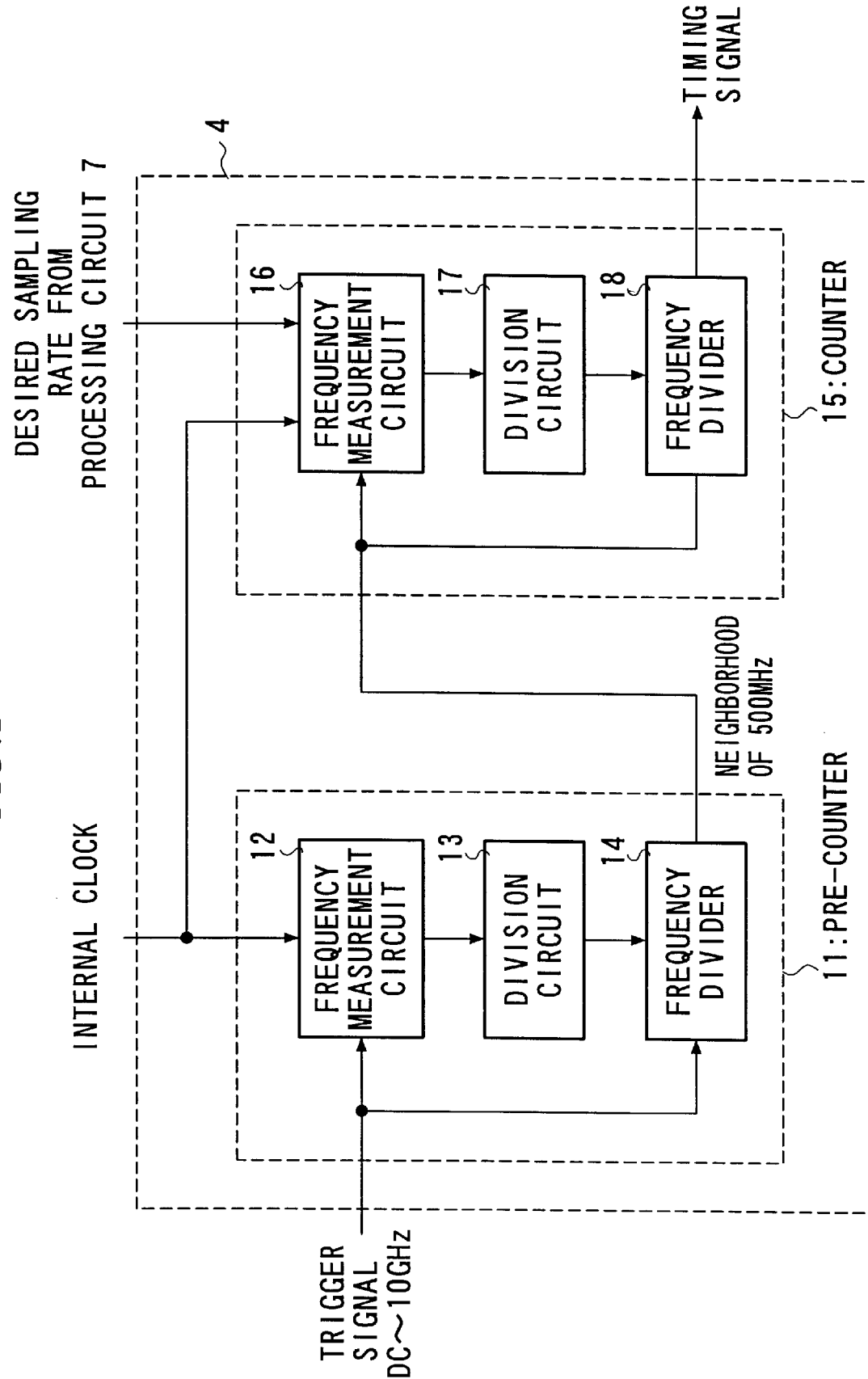
FIG. 1 shows the structure of a timing generation circuit in the EOS oscilloscope in the first embodiment of the present invention.

FIG. 1 shows a structure of the timing generation circuit 4 of an EOS oscilloscope according to the first embodiment of the present invention. Here, the timing generation circuit 4 shown in FIG. 1 is used when the frequency from the trigger circuit 3 is higher than the frequency of the desired sampling rate.

In FIG. 1, the timing generation circuit 4 basically comprises a pre-counter 11 which converts trigger signal to the region of a specified frequency, and outputs the result, and a counter 15 which converts the output from the pre-counter 11 as desired sampling rate signals, and outputs them as timing signals.

Here, the trigger signal, for example, is input over a wide band up to a high frequency of 10 [GHz] from direct current. Because of this, the pre-counter 11 is constructed of comparatively high value parts which can operated even at a high frequency, frequencies of the trigger signals are dropped to a specified frequency by the pre-counter 11, and the counter 15 is constructed of comparatively inexpensive parts which operate at or below a specified frequency (for example 500 [MHz]). By constructing the timing generation circuit 4 so that the pre-counter 11 and the counter 15 respond to different frequencies, it is possible to reduce the cost of the parts for the timing generation circuit 4 as a whole.

Here, the pre-counter 11 comprises frequency measurement circuit 12 which generates a gate signal which is a specified multiple N of the cycle of a specified frequency output from the pre-counter 11 and counts the input trigger signals during the gate interval of the gate signal, a division circuit 13 which divides the count value of the frequency measurement circuit 12 by the specific multiple N, and determines a divider ratio, and a frequency divider 14 which divides the gate signal by the divider ratio determined by the division circuit 13 and outputs the divided signal to the counter 15.

In addition, the counter 15 comprises frequency measurement circuit 16 which generates a gate signal which is a specified multiple M of the cycle of a the desired sampling rate set by the processing circuit 7, and counts the signal input from the pre-counter 11 during the gate interval of this gate signal, a division circuit 17 which divides the count value of the frequency measurement circuit 16 by the specific multiple M, and determines a divider ratio, and a frequency divider 17 which divides the signal input from the pre-counter 11 by the divider ratio determined by the division circuit 17, and outputs the result as a timing signal.

Next, the operation of the timing generation circuit 4 in this EOS oscilloscope will be explained. Moreover, here the specific case will be explained wherein the trigger signals input into the timing generation circuit 4 are 2 [GHz], the internal clock is 100 [MHz], the desired sampling rate is 4 [MHz], and the signal output from the pre-counter 11 is in the region of 500 [MHz].

First, in the frequency measurement circuit 12 of the pre-counter 11, the trigger signal and the internal clock signal are input. Then, the frequency measurement circuit 12 generates a gate signal which is a specific multiple N of the cycle of a specific frequency output from the frequency divider 14, and counts the trigger signal during the gate interval of this gate signal. In the above-described example, if the cycle of the specific frequency of 500 [MHz] is 2 [nS], the specific multiple N is 100, then the gate interval is 200 [nS], and using the internal clock of 100 [MHz], a gate signal of 200 [nS] is generated. In addition, when the trigger signals are counted during a gate interval of 200 [nS], the count value is 400 with an error in the range of ±1, that is, it is one of the count values 399, 400, or 401.

Next, the count value determined in the frequency measurement circuit 12 is sent to the division circuit 13, and a divider ratio is determined by dividing this count value by the specified multiple N used in the frequency measurement circuit 12, and this divider ratio is sent to the frequency divider 14. Here, if the division circuit 13 has a round-off function which discards a remainder of 4 or below and increments when a remainder is 5 or greater, in the case of this example, when the count value 400±1 is divided by 100 (=N), the divider ratio is 4. Moreover, here division circuit 13 is not limited to a round-off function that discards a remainder of 4 or below and increments when a remainder is 5 of greater, but having a function which increments or discards is desirable. In this case, the count value which gives the change-over value of the divider ratio changes according to the function possessed by the division circuit 13.

In addition, in the frequency divider 14, the trigger signals are divided by the divider ratio determined by the division circuit 13, so the specified frequency signals are generated from the trigger signals. For example, if 2 [GHz] trigger signals are divided by a divider ratio of 4, the trigger signals are divided into 500 [MHz], and the result is output.

Next, in the frequency measurement circuit 16 of the counter 15, the signal from the pre-counter 11 which gives the specified frequency region, the internal clock signal, and the information relating to the desired sampling rate from the processing circuit 7 are input. Then, the frequency measurement circuit 16 generates from the internal clock a gate signal which is a specified multiple M of the cycle of the desired sampling rate output from the frequency divider 18, and counts the signals from the precounter 11 during the gate interval of the gate signal. For example, if the cycle of the desired sampling rate is 250 [nS] and the specified multiplier M is 100, then the gate interval is 25 [μS]. Here, using the 100 [MHz] internal clock, a gate signal of 25 [μS] is produced. In addition, during the 25 [μS] gate interval, when the trigger signal from the pre-counter 11 is counted, the count value is 12500±1.

Next, the count value measured by in the frequency measurement circuit 16 is sent to the division circuit 17, the divider ratio is determined by dividing this count value by the specified multiple M used in the frequency measurement circuit 16, and this divider ratio is sent to the frequency divider 18. For example, because the count value 12500±1 is divided by 100 (=M), the divider ratio is 125.

Then in the frequency divider 18, by dividing the signals from the pre-counter by the divider ratio determined by the division circuit 17, it is possible to output the timing signal which gives the desired sampling rate. For example, dividing the 500 [MHz] signal from the pre-counter by the divider ratio 125, the result is a desired sampling rate of 4 [MHz].

In this manner, in the frequency measurement circuits 12 and 16, the gate signal with the specified multiple of the necessary cycle is produced, and the input signal is counted, and by dividing it by the specified multiple in the division circuit 13 and 17, it becomes possible to determine the divider ratio with a precision of (1/specified multiple). Here, the precision of (1/specified multiple) is due to the error of the count value in the frequency measurement circuits 12 and 16 being ≅1, and dividing this error value in the division circuits 13 and 17 by the specified multiples N and M, respectively. As a result, the divider ratio can be precisely determined, and the timing signal which give s the desired sampling rate can be generated. Finally, an electro-optic sampling oscilloscope which can carry out precise signal measurement of a measured circuit can be realized.

Moreover, in the present embodiment, when the frequency of the trigger signals are lower than the specified frequency output from the precounter 11, the divider ratio sent to the frequency divider 14 from the division circuit 13 is arbitrarily set to 1.

Figure 2:
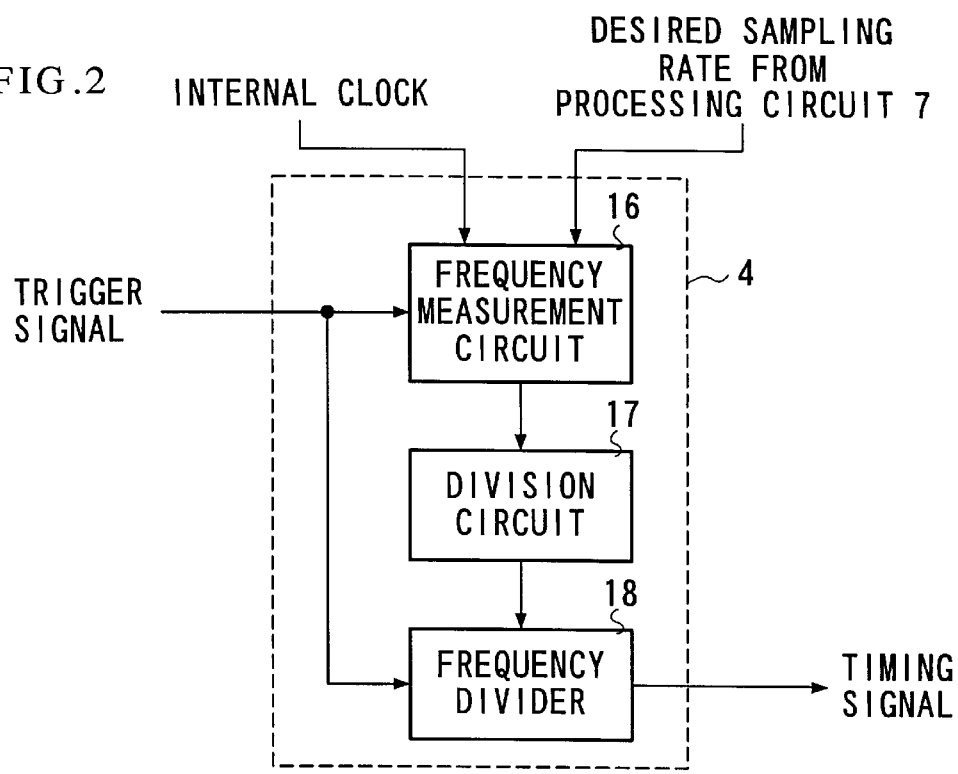
FIG. 2 shows another structure of the timing generation circuit in the EOS oscilloscope in the first embodiment of the present invention.

In addition, if the timing generation circuit 4 is constructed from parts that operate at a high frequency, the timing generation circuit 4 in the present embodiment is constructed as in FIG. 2, and the same effect can be achieved when the trigger signals are input to the frequency measurement circuit 16 and th e frequency divider 18. Moreover in FIG. 2, the reference symbols for corresponding parts are identical to those of FIG. 1, and its explanation is omitted.

[Second Embodiment]

In the above-described embodiment, the trigger signals are directly input into the frequency measurement circuit 12 of the pre-counter 11. However, there are cases wherein the trigger signals are of a high frequency, such as the 10 [GHz] mentioned above. For trigger signals having this kind of high frequency, the count operation of the trigger signals in the frequency measurement circuit 12 becomes impossible to follow, and there are cases in which the count operation cannot be guaranteed.

Here, in the second embodiment, we will explain the case in which even if such a high frequency trigger signals are input, the count operation in the frequency measurement circuit 12 can guaranteed.

Figure 3:
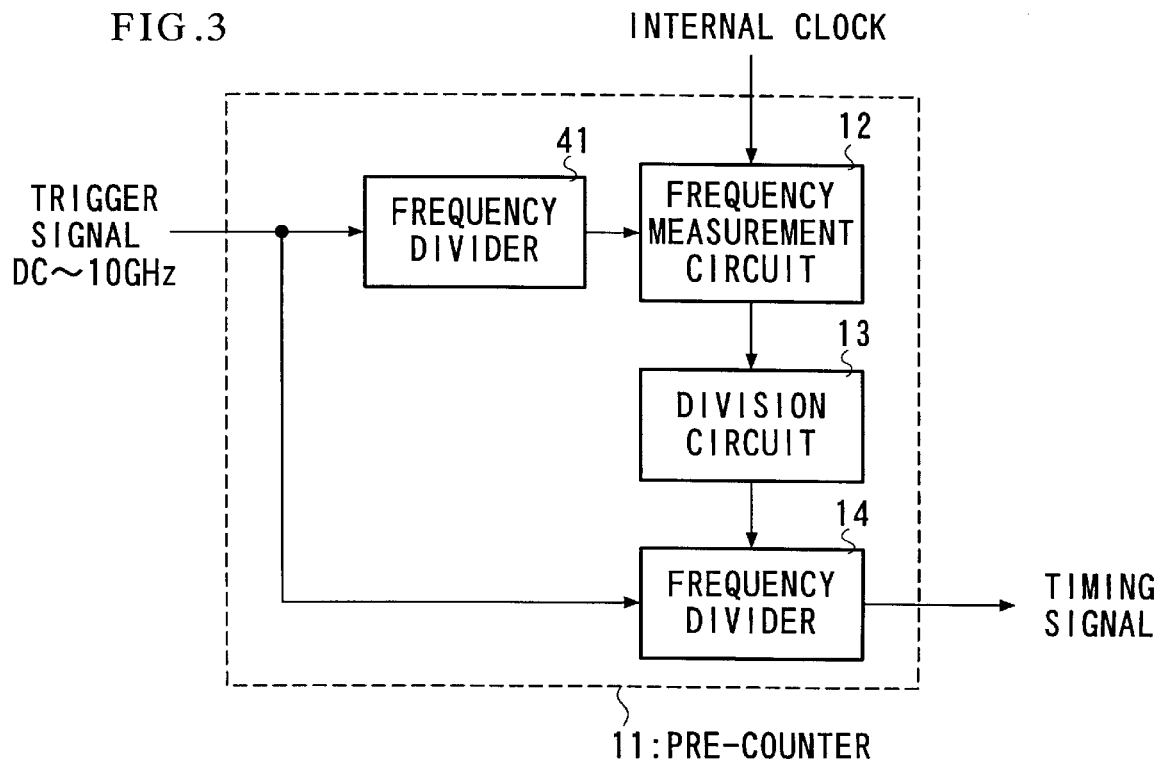
FIG. 3 shows the structure of a pre-counter according to the second embodiment of the present invention.

FIG. 3 shows an example of the structure of the pre-counter 11 of the timing generation circuit 4 in the second embodiment. In this figure, each part which corresponds to a part in FIG. 1 has the same reference symbol, and the explanation has been omitted.

As can be understood by comparing the structures of the pre-counter 11 of the second embodiment (FIG. 3) and the pre-counter 11 of the embodiment shown in FIG. 1, on the pre-counter 11 in the second embodiment, a frequency divider 41 is provided which carries out division with the specified divider ratio before processing by frequency measurement circuit 12.

Below, the operation of the pre-counter 11 provided with this frequency divider 41 is explained, and as the explanation of other parts which are the same as those in the above-described embodiment, their explanation has been omitted. In addition, in the explanation below, a specific case will be explained wherein the trigger signals input into the timing generation circuit 4 are 10 [GHz], the divider ratio of the frequency divider 46 is 8, the internal clock is 100 [MHz], and the signal output from the pre-counter 11 is in the region of 500 [MHz].

First, the trigger signals are divided by the divider ratio from the frequency divider 41. For example, because the 10 [GHz] trigger signals are divided by the divider ratio of 8, a 1.25 [GHz] signal is output.

In the frequency measurement circuit 12, signals from the frequency divider and the internal clock are input. Then, by using the specified multiple N for the cycle of the specified frequency (F [S]) and the divider ratio R from the frequency divider 41, the frequency measurement circuit 12 generates a gate signal from the internal clock as:

gate interval $T[S]=F \times N \times R$, and carries out counting of the signal from the frequency divider 41 during the gate interval of this gate signal. In the example mentioned above, if the 500 [MHz] cycle of the specified frequency output from the frequency divider 14 is F=2 [nS], the divider ratio R=8, and the specified multiple N=100, then the gate interval is 1600 [nS] (=2×100×8). Here, by using the 100 [MHz] internal clock, a gate signal of 160 [nS] is produced. In addition, in the 1600 [nS] gate interval, when the signal from the frequency divider 41 is counted, the count value is 2000±1.

Next, the count value measured by the frequency measurement circuit 12 is sent to the division circuit 13, the divider ratio is determined by dividing (C/N) this count value (C) by the specified multiple N used in the frequency measurement circuit 12, and this divider ratio is sent to the frequency divider 14. For example, if the count value is 2000±1 and the specified multiple N=100, then the divider ratio is 20.

Next, in the frequency divider 14, by the trigger signals are divided by the divider ratio determined in the division circuit 13, it is possible to divide the trigger signals by the specified frequency. For example, if the 10 [GHz] trigger signals are divided by the divider ratio of 20, the result is a specified frequency of 500 [MHz].

In this manner, by providing a frequency divider 41 wherein division by a specified divider ratio is carried out prior to the processing of the frequency measurement circuit 12, even if a high frequency trigger signals are input into the pre-counter 11, a signal of which frequency is lower than the frequency of trigger signal can be input into the frequency measurement circuit 12. Thus, it is possible to carry out counting at a frequency lower than the trigger signals, and the count operation can be guaranteed.

Moreover, in the counter 15 in FIG. 1 as well, by making a structure provided with a frequency divider which divides by a specified divider ratio prior to the frequency measurement circuit 16 processing in the same manner as the pre-counter 11 explained in this second embodiment, it is possible to construct a counter 15 by using the parts which operate at a lower frequency, and the fabrication cost of the counter 15 can be lowered.

Figure 4:
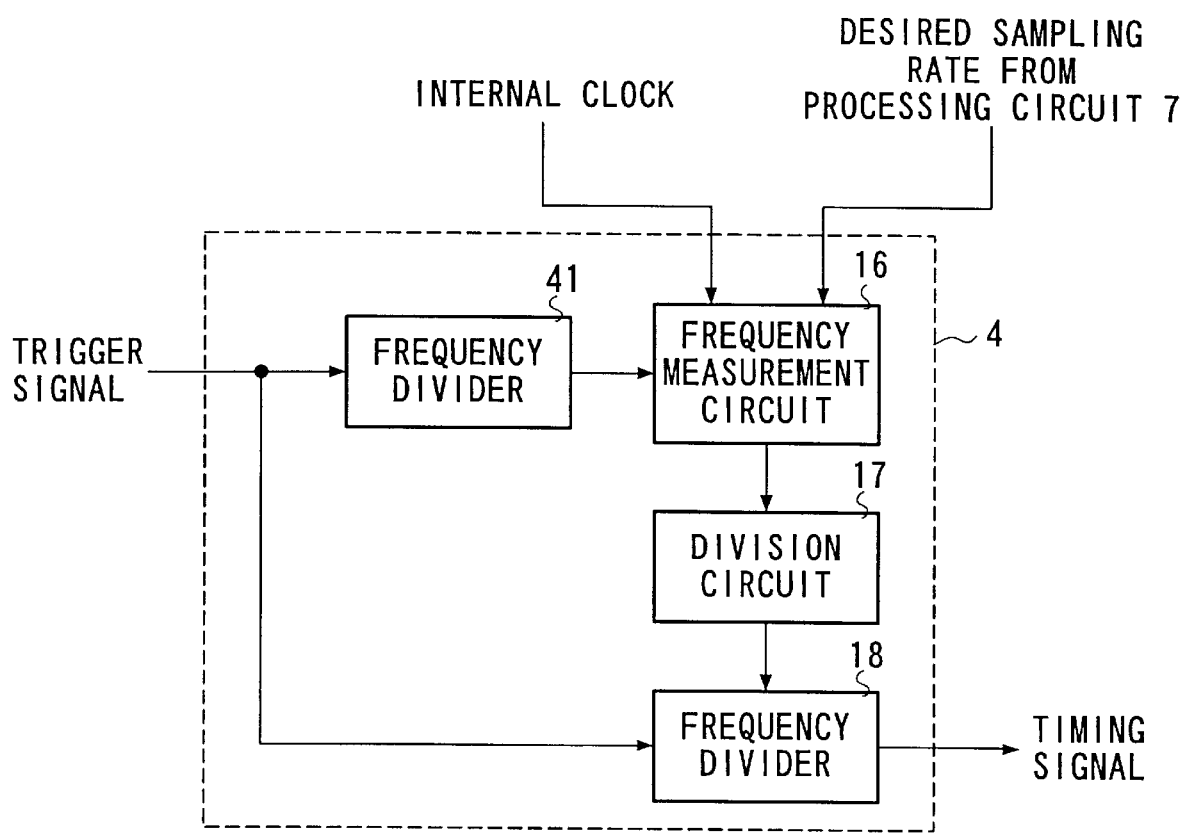
FIG. 4 shows another structure of the timing generation circuit according to the second embodiment of the present invention.

In addition, if the timing generation circuit 4 in this second embodiment is constructed with parts that operate even at a relatively high frequency, when the timing generation circuit 4 is constructed as shown in FIG. 4, the same effects described above can be attained. Moreover, the reference symbols in FIG. 4 for the corresponding parts in FIG. 1 and FIG. 3 are identical, and their explanation is omitted.

[Third Embodiment]

The trigger signal input into the timing generation circuit 4 is not always a stable frequency, and fluctuations in frequency, called "jitter", are produced. In particular, when a trigger signal at a frequency near the change-over value of the divider ratio is input, and when this trigger signal has jitter, the divider ratio continuously changes, and it is impossible to output a stable timing signal. Here, a third embodiment is explained wherein an EOS oscilloscope can output a stable timing signal for sampling even when the trigger signal has jitter.

Figure 5:
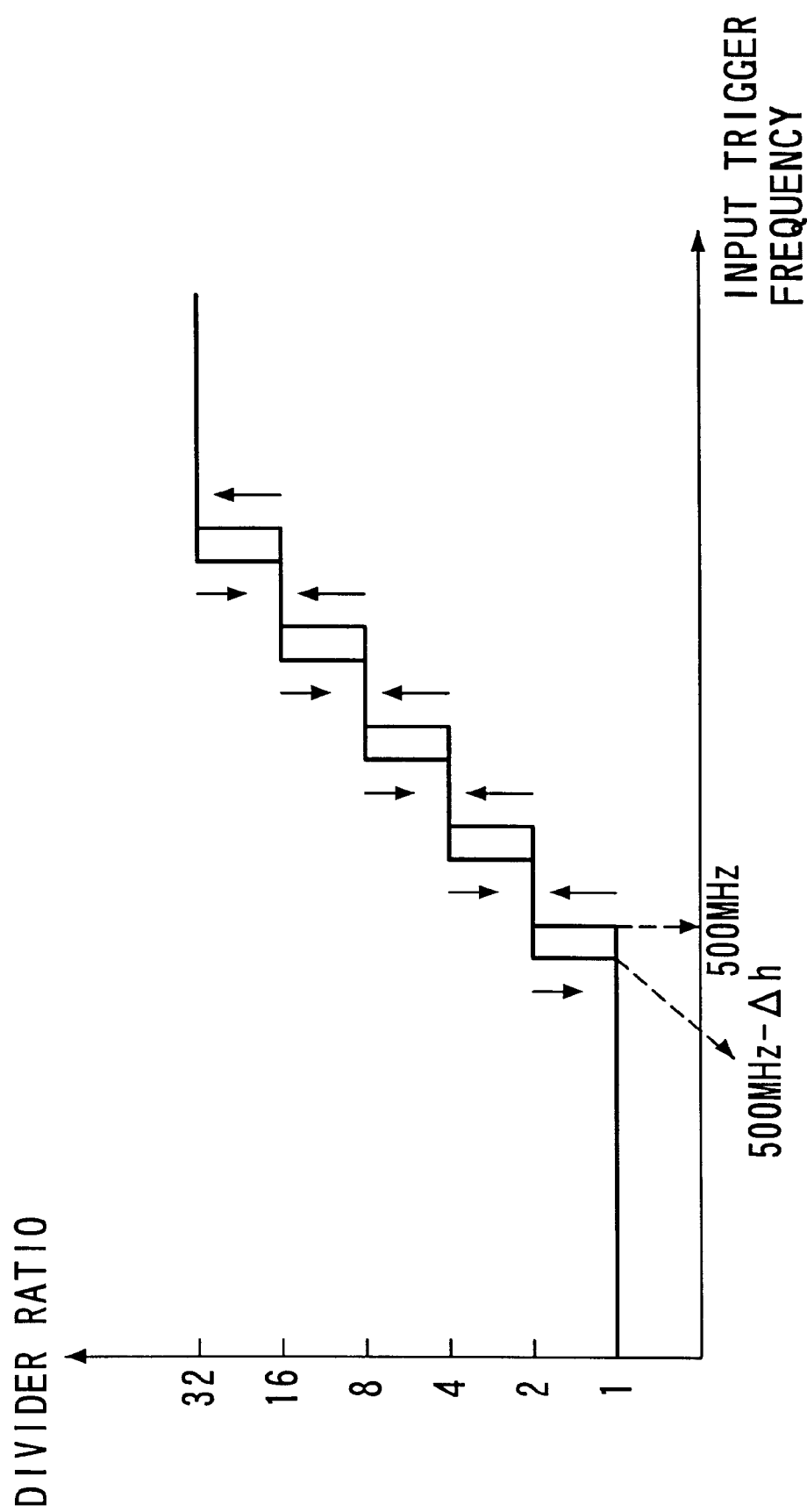
FIG. 5 explains the concept of digital hysteresis.

First, the concept behind the measures for dealing with the trigger signal having jitter will be explained referring to FIG. 5. FIG. 5 shows the operational concept of the third embodiment in the pre-counter 11 in FIG. 1. In FIG. 5, as an example, the output from the pre-counter 11 is in the region of 500 [MHz], and the divider ratio for the trigger signal in the pre-counter 11 is $2^n$ (n is an integer greater than 0) for the sake of simplifying the circuit structure of the frequency divider 14.

As a measure for dealing with input of trigger signals with a frequency near the change-over value of the divider ratio, when determining the divider ratio, digital hysteresis, in which the divider rate is changed depending on the rise and fall in the frequency of trigger signals, is provided. For example, in FIG. 5, when the frequency of the trigger input signals are lower than 500 [MHz], the divider ratio is 1. From this condition, the frequency of the trigger signals gradually increases, and when it traverses 500 [MHz], the divider ratio is 2. However, due to jitter, etc., even if the frequency of the trigger signal falls only slightly below 500 [MHz], as long as it does not cross 500–Δh [MHz], the divider ratio remains 2. Then, only when the frequency of the trigger signal falls below 500–Δh [MHz], will the divider ratio return to 1. In the same manner, in each of the divider ratio regions, for example, by determining the divider ratio after providing digital hysteresis, if the jitter is less than the hysteresis range Δh, then the output from the frequency divider 14 will be stable.

Moreover, here, the hysteresis range Δh can change corresponding to the jitter of the trigger signals, for example, 1~10% of the frequency in the derivation of the divider ratio.

Figure 6:
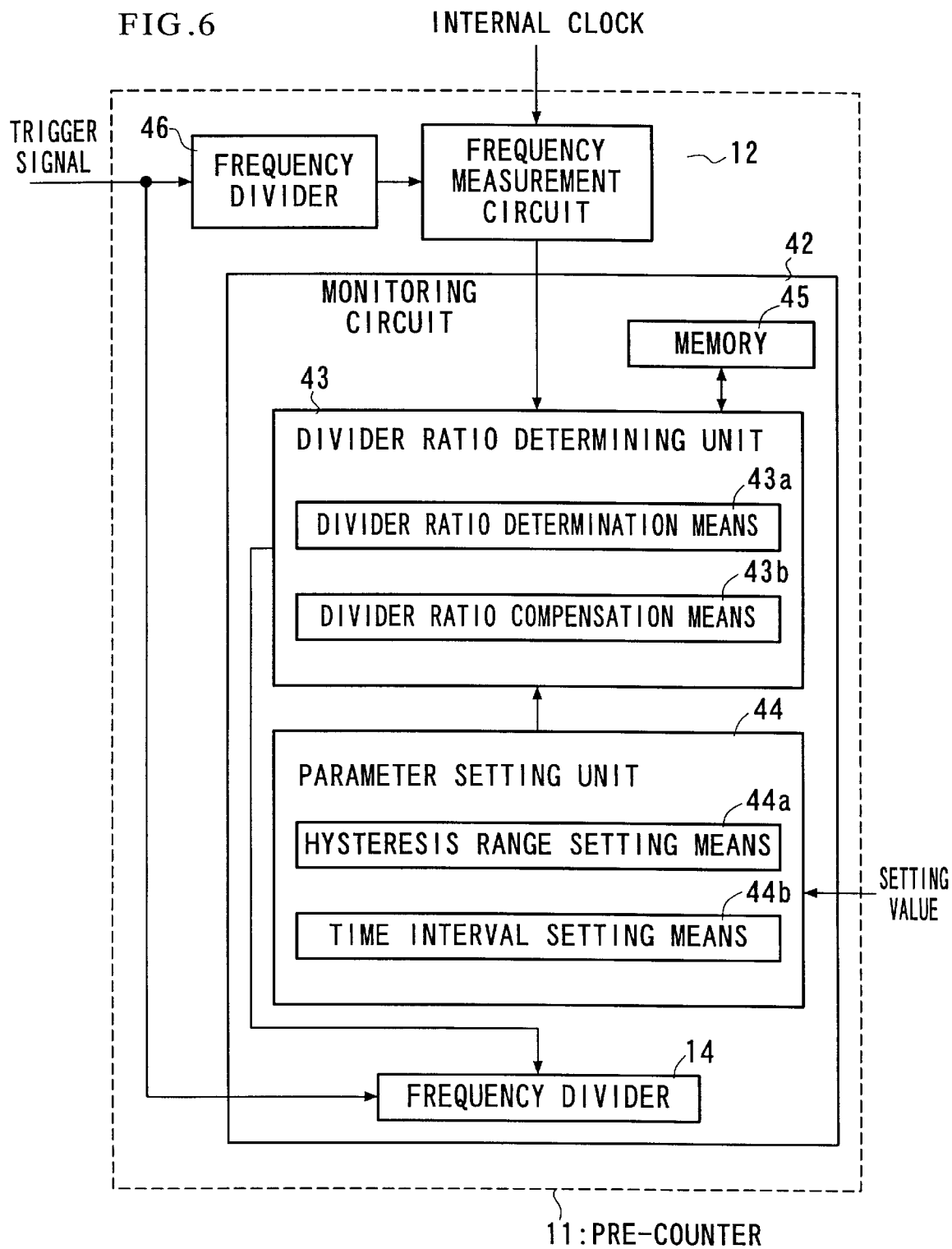
FIG. 6 shows a structure of the pre-counter according to the third embodiment of the present invention.

FIG. 6 shows the structure of the third embodiment of the pre-counter 11 shown in FIG. 1.

The pre-counter 11 in the third embodiment comprises a frequency divider 46 which divides the trigger signal by a specified divider ratio, a frequency measurement circuit 12 which generates a gate signal and counts the signal from the frequency divider 46 during the gate interval of this gate signal, a monitoring circuit 42 which determines the divider ratio after providing the digital hysteresis based on the count value of the frequency measurement circuit 12, and a frequency divider 14 which divides the trigger signal by the divider ratio determined by the monitoring circuit 42.

In addition, the monitoring circuit 42 comprises a divider ratio determining unit 43 which determines the divider ratio, a parameter setting unit 44 for setting the parameter at the time of the divider ratio determination, and a memory 45 which stores the information related, for example, to the count number from the frequency measurement circuit 12. Furthermore, the divider ratio determining unit 43 comprises a divider ratio determination means 43a which determines the condition of the change in the frequency of the trigger signals by using the count value from the frequency measurement circuit 12, and determines the divider ratio based on this result and information for determining the divider ratio which provides digital hysteresis from the count value, and a divider ratio compensating means 43b which monitors the divider ratio determined by the divider ratio determining means 43 during a specified time interval and determines the final divider ratio according to the change in the divider ratio. In addition, the parameter setting unit 44a comprises a hysteresis range setting means 44 for setting the hysteresis range, and a time interval setting means 44b, which sets the time interval in the divider ratio compensating means 43b.

Next the operation of the pre-counter 11 which structures the timing generation circuit 4 in this EOS oscilloscope will be explained. Moreover, because the other parts are the same as those in the above-described embodiments, their explanation will be omitted. In addition, in the explanation of the operation below, a different specific case will be explained wherein the internal clock is 100 [MHz], the signal output from the pre-counter 11 is in the region of 500 [MHz], the divider ratio of the frequency divider 46 is 32, and the divider ratio of the frequency divider 14 is $2^n$ (n is an integer such that $0 \leq n \leq 5$).

First, the trigger signals are input into the frequency divider 46, and divided by the specified divider ratio.

Signals from the frequency divider 46 and the internal clock are input into the frequency measurement circuit 12. Then the frequency measurement circuit 12 generates a gate signal using a specified multiple N for the cycle (F [S]) of the specified frequency and the divider ratio R of the frequency divider 46, and counts the signal from the frequency divider 46 during this gate interval.

In the above example, if the cycle of the specified frequency 500 [MHz] output from the frequency divider 14 is 2 [nS], the divider ratio of the frequency divider 46 is 32, the specified multiple N is 100, then the gate interval will be 6.4 [μS] (=2 [nS]×100×32).

Here, if the count error is ±1 due to the asynchronicity of the internal clock is taken into consideration, then double the count number is necessary. If the stabilization coefficient is estimated to be 5 times, a gate interval of:

$$2[nS] \times 32 \times 100 \times 5 = 32[\mu S]$$

is obtained. The frequency measurement circuit 12 generates from the internal clock a gate signal having this interval, and counts the signals from the frequency divider 46.

Next, the divider ratio determining means 43a of the monitoring circuit 42, compares information related to the count value from the frequency measurement circuit 12 with the information related to the count value input immediately before this count value, determines whether or not the frequency of the trigger signals have increased or decreased, and from the results of this determination and information related to the divider ratio for the count value, determines the divider ratio. Moreover, in order to determine a state of increase or decrease, at least the present count value and information related to the count value immediately before this are stored in the memory 45.

The information related to the divider ratio for the count value in the above-described example is shown in FIG. 7. In FIG. 7, the information used in the divider ratio determination means 43a is the gate time (32 [μS] count number) shown as reference symbol a1 and the divider ratio a2 corresponding to it. Moreover, in this information, the hysteresis range Δh is set to 1%. Finally, the relation between this information and the trigger input frequency a3 is exhibited in FIG. 7.

For example, when in an increasing state the count number is 500 or less, in the case of the area shown by reference symbol b1, the divider ratio becomes 1 due to the corresponding relationship with the divider ratio. The frequency of the trigger signal gradually increases from this state, and when the count number exceeds 501 (the area of reference symbol b2), the divider ratio becomes 2. In contrast, even when in a decreasing state due to jitter, etc., and the count number is slightly below 500, the count number is 496 or greater (the area of reference symbol b3), the divider ratio is 2. In addition, when in a decreasing state the count number is 495 or below (the area of reference symbol b4), the divider ratio returns to 1. In the same manner, in the region of each divider ratio, by providing digital hysteresis of 1% of the range, and the divider ratio is determined according to the increasing state or decreasing state.

Next, the divider ratio determined by the divider ratio determination means 43a is monitored by the divider ratio compensation means 43b for a specified time interval, and when there are large changes in the divider ratio because of the mixing of noise in the trigger signals, etc., this divider ratio undergoes cancellation processing, and the final divider ratio is determined.

The operation of this divider ratio compensation means 43b is explained in detail using FIG. 8.

As shown in part (a) in FIG. 8, suppose that the value of the past divider ratio determined by the divider ratio determination means 43a is γ1, and the divider ratio is suddenly determined to be γ2 due to noise. The divider ratio compensation means 43b refers to the divider ratio determined within a specified time interval α in the past from the divider ratio presently determined by the divider ratio determination means 43a, and in the case that there is a large fluctuation in the divider ratio, determines whether there has been any influence due to noise, etc., compensates the final divider ratio by γ1 as shown in part (a) in FIG. 8, and outputs the results to the frequency divider 14.

In contrast, when the divider ratio determined by the divider ratio determination means 43a as shown in part (a) in FIG. 8 shifts from divider ratio γ1 to γ2 due to alteration in the frequency of the trigger signal at time β1, as shown in part (d) in FIG. 8, the divider ratio compensation means 43b sets the final divider ratio to γ1 from time β1 to the time β1 following the passage of the specified time interval α, and only after the time β1, the divider ratio γ2 is output. Moreover, even if the specified time interval α is 100 times the gate interval, because the order of the gate interval here is milliseconds, even if there is a delay of the specified time interval α in the change of this kind of divider ratio, there are not any particular problems.

In the frequency divider 14, by dividing the trigger signal by the divider ratio finally determined in the divider ratio compensation means 43b, the trigger signals are divided into a specified frequency region, and output.

Moreover, in FIG. 6, the proportion of the hysteresis range Δh used by the divider ratio determination means 43a is set by the hysteresis range setting means 44a of the parameter setting unit 44 via the setting unit 8 and the processing unit 7. In this way, the hysteresis range can be set depending on the state of the trigger signals.

In addition, in the same manner by the time interval setting means 44b, the specified time interval used in the divider ratio compensating means 43a is set. In this manner, the specified time interval can be set depending on the noise conditions, etc.

Figure 9:
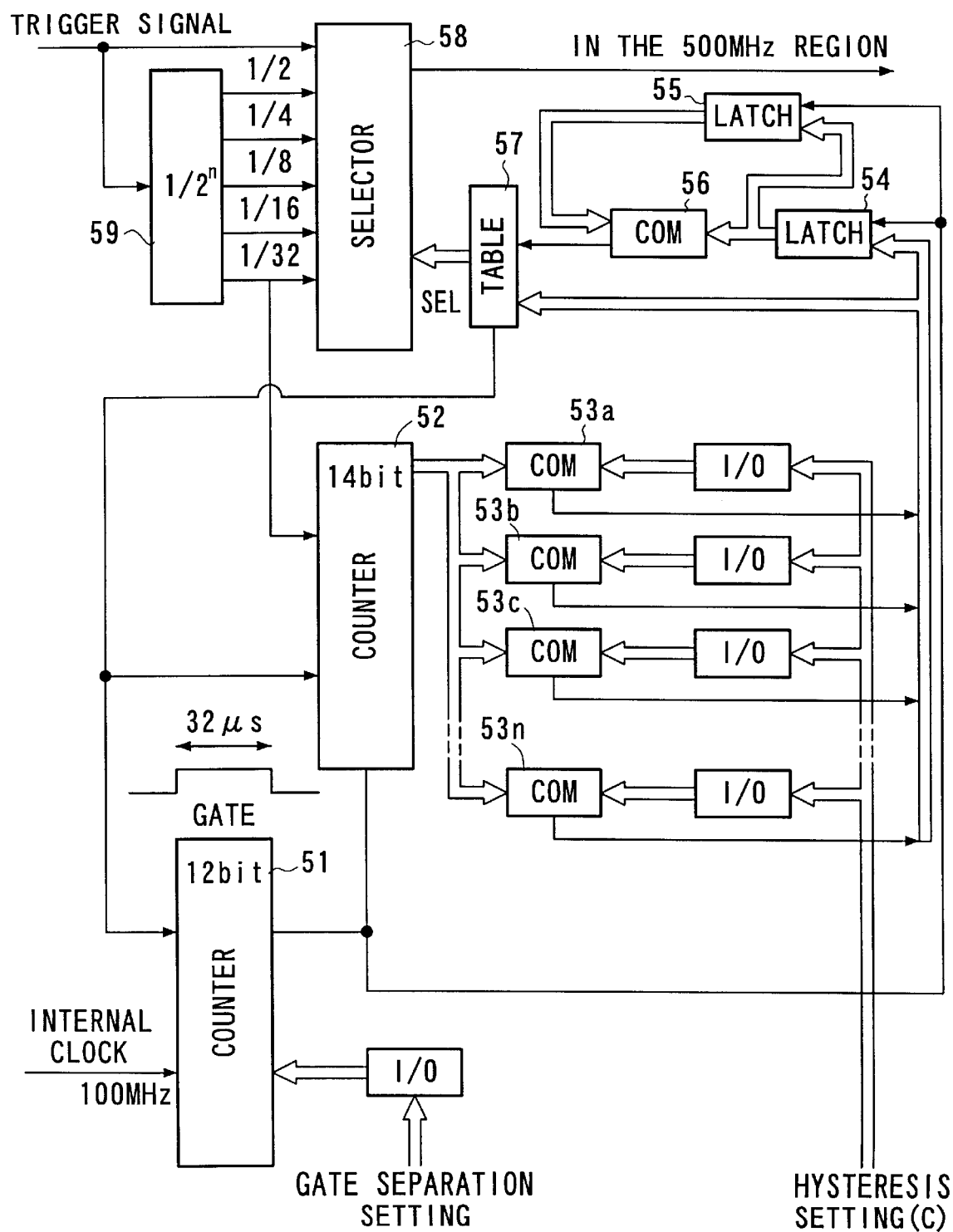
FIG. 9 shows an example of the circuit structure of the pre-counter according to the third embodiment of the present invention.
Figure 10:
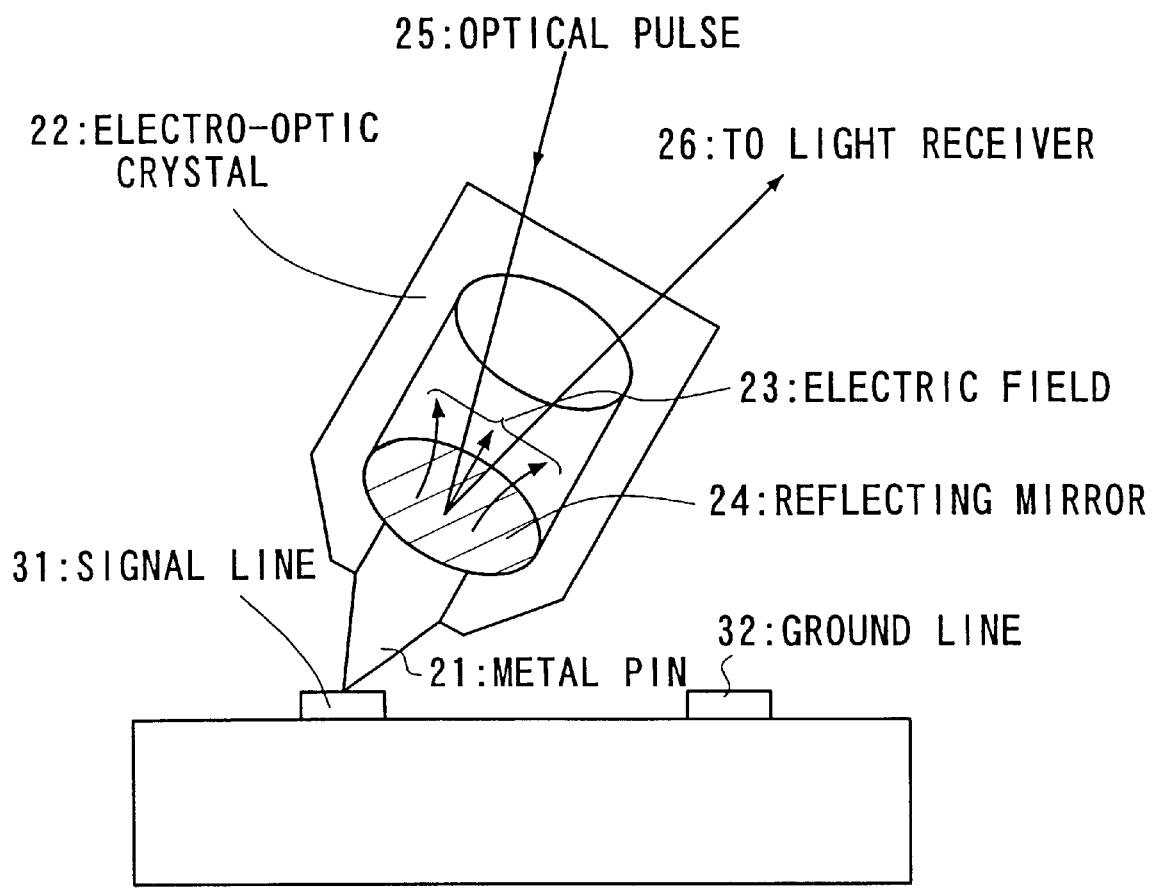
FIG. 10 explains the measurement concept of the electro-optic probe in the EOS oscilloscope.

FIG. 9 shows a concrete circuit structure of the pre-counter 11, omitting the divider ratio compensation means 43b and the time interval setting means 44b in FIG. 6.

In FIG. 9, the divider ratio 32 in the frequency divider 59 corresponds to the frequency divider 46 in FIG. 6.

In addition, the frequency measurement circuit 12 of FIG. 6 corresponds to the counter 51 and the counter 52 in FIG. 9. Here, the counter 51 generates a gate signal using the internal clock, and the counter 52 carries out counting of the signals divided by the divider ratio 32 in the frequency divider 59 during this gate interval.

In addition, the divider ratio determination means 43a corresponds to the comparators 53a~53n, comparator 56, and table 57, and the hysteresis range setting unit 44a corresponds to the hysteresis setting (c), and the memory 45 corresponds to the latches 54 and 55. Here, the range of the count value is determined by the comparators 53a~53n, and the result is output to the latch 54 and the table 57. In addition, the value of the latch 54 which stores the present result and the value of the latch 55 which stores the result from one step earlier are compared by the comparator 56, and it is determined whether it is increasing or decreasing stage, and the result of this determination is input to the table. In table 57, the divider ratio is determined by these two pieces of input information, and the result is sent to the selector 58.

In addition, the frequency divider 14 in FIG. 6 corresponds to the frequency divider 59 and the selector 58 in FIG. 9. Here, depending on the divider ratio sent from the table 57, the selector 58 selects one of the trigger signals divided by $2^n$ (n is an integer such that $0 \leq n \leq 5$), and outputs it a frequency in the 500 [MWz] region.

Moreover, in the third embodiment, the divider ratio of the frequency divider 14 in FIG. 6 was explained to be $2^n$ (n is a natural number greater than 0) to simplify the circuit structure, but it is not limited to this structure.

In addition, in the frequency measurement circuit 12 of FIG. 6, if the count operation, etc., of the signal is guaranteed, the frequency divider 46 can be eliminated, and processing carried out by inputting the trigger signals directly into the frequency measurement circuit 12.

Additionally, if it is possible to construct the timing generation circuit 4 with parts that can operate even at a high frequency, the precounter 11 in FIG. 6 can be used as is as a timing generation circuit 4. Moreover, in this case, in the frequency measurement circuit 12, a the desired sampling rate is further input from the processing circuit 7, and in the frequency measurement circuit 12, the gate signal is produced based on the cycle of this desired sampling rate. Also, the output from the frequency divider 14 gives the timing signal.

As explained above, the following effects can be obtained the electro-optic sampling oscilloscope according to the present invention:

According to the invention described in the second embodiment, the timing generation circuit of an electro-optic sampling oscilloscope generates a gate signal of a specified multiple N of the cycle of the desired sampling rate, counts the input trigger signals during the gate interval of said gate signal, and divides the count value by said specified multiple N, and determines a divider ratio. In this manner, a divider ratio can be determined at a precision of (1/specified multiple), and a timing signal which gives a precise desired sampling rate can be generated.

In addition, according the invention described in the second embodiment, the timing generation circuit further comprises a frequency divider which divides said trigger signals, and uses the product of said specific multiple N and the divider ratio as a multiple K, and counts the signals from the frequency divider during the gate interval of the gate signal. In this manner, even if a trigger signal with a high frequency is input, it can be counted as a signal as lower frequency, and the count operation can be guaranteed.

Next, according to the invention described in the first embodiment, the timing generation circuit of an electro-optic sampling oscilloscope circuit comprises a pre-counter and a counter. And the pre-counter generates a gate signal of a specified multiple N of the cycle of the specified frequency, counts the input trigger signals during the gate interval of the gate signal, divides this count value by the specified multiple N, and determines a divider ratio. In addition, the counter generates a gate signal which is a specific multiple M of the cycle of the desired sampling rate, counts the signals input from the pre-counter during the gate interval of the gate signal, divides the count value by the specified multiplier M, and determines a divider ratio. In this manner, the divider ratio can be determined to a precision of (1/specific multiple), and can generate a timing signal which gives the precise desired sampling rate. Furthermore, in this manner a timing generation circuit can be structured from the pre-counter and the counter which have differing corresponding frequencies, and it is possible to reduce the parts cost of the timing generation circuit as a whole.

In addition, according to the invention described in the first and second embodiments, the pre-counter is further provided with a frequency divider which divides the trigger signals, the product of said specified multiplier N and divider ratio is a multiple K, generates a gate signal which is a multiple K of the cycle of the specified frequency, and counts the signals from said third frequency divider during the gate interval of said gate signal. In this manner, even when a high frequency trigger signals are input, it can be counted as a signal of lower frequency, and it is possible to guarantee the count operation.

Additionally, according to in the invention described in the first and second embodiment, the timing generation circuit is further provided with a frequency divider which divides the signal input from said pre-counter, and makes the product of said specified multiple M and the divider ratio as a multiple L, generates a gate signal for a gate interval which is a multiple L of the period of the desired sampling rate, and counts the signals from said third frequency divider during the gate interval of the gate signal. In this manner, the counter can be structured using parts which operated with lower frequencies, and the fabrication cost of the counter 15 can be reduced.

Next, according to the invention described in the third embodiment, the timing generation circuit of an electro-optic sampling oscilloscope generates a gate signal according to the desired sampling rate, and counts the input trigger signals during the gate interval of the gate signal, and determines the divider ratio from the count value by providing digital hysteresis. In this manner, in the frequency of each frequency ratio region, even when the trigger signal has jitter, it is possible to achieve a stable output, and outputs the result as a timing signal.

Next, according to the invention described in the third embodiment, the timing generation circuit of an electro-optic sampling oscilloscope comprises a pre-counter and a counter, and pre-counter generates a gate signal depending on said specified frequency, counts the input trigger signals during the gate interval of said gate signal, and determines the divider ratio from the count value by providing digital hysteresis. In this manner, in the frequency of each frequency region, even if there is jitter in the trigger signals, it is possible to achieve a stable output. Furthermore, in this manner it is possible to structure the timing generation circuit from the pre-counter and the counter with differing corresponding frequencies, and it is possible to reduce the cost of parts of the timing generation circuit as a whole.

In addition, according to the invention described in the third embodiment, the monitoring circuit can se t the hysteresis range. In this manner, the hysteresis range can be set depending on the state of the trigger signal.

In addition, according to the invention described in the third embodiment, the monitoring circuit determines the final divider ratio by monitoring the divider ratios determined by providing digital hysteresis during a specific time interval. In this manner, a measure is possible for the case in which the divider ratio changes drastically due to noise being mixed in the trigger signals.

In addition, according to the invention described in the third embodiment, the monitoring circuit can set the specified time interval when determining the final divider ratio. In this manner, it is possible to set the specified time interval depending on the noise condition, etc.

In addition, according the invention described in the first to third embodiments, the timing generation circuit is further provided with a trigger signal frequency divider which divides the trigger signals, generates a gate signal for the gate interval wherein the gate interval is a multiple of the divider ratio in the trigger signal frequency divider, and counts the signals from the trigger signal frequency divider during the gate interval of said gate signal. In this manner, even if high frequency trigger signals are input, it is possible to guarantee the count operation.

What is claimed is:

1. An electro-optic sampling oscilloscope which carries out measurement of a measured signal using an optical pulse generated based on a timing signal from a timing generation circuit, wherein said timing generation circuit comprises;

a frequency measurement circuit which generates a gate signal having a predetermined pulse width according to a desired sampling rate, and counts trigger pulses of a trigger signal during a pulse of said gate signal;

a monitoring circuit which includes a divider ratio determination means having a ratio table including at least one of a preset upper limit value and a preset lower limit value of trigger pulse count corresponding to each divider ratio, the ratio determination means determines a divider ratio based the ratio table and on the count value of the trigger pulses of the trigger signal from said frequency measurement circuit; and a first divider which divides said trigger signal by a divider ratio determined by said divider ratio determination means, and outputs the result as a timing signal.

2. An electro-optic sampling oscilloscope according to claim 1, the monitoring circuit further comprising a hysteresis range setting means which changes at least one of the upper limit value and the lower limit value corresponding to each of the divider ratios based on externally inputted values.

3. An electro-optic sampling oscilloscope according to claim 2, wherein the monitoring circuit further comprises a divider ratio compensation means which changes a divider ration determined by said divider ratio determination means, outputs the changed divider ratio as a final divider ratio if the divider ratio persists for a specified time interval, wherein the first divider divides the trigger signal by the final divider ratio and outputs the result as the timing signal.

4. An electro-optic sampling oscilloscope according to claim 3, wherein said monitoring circuit further comprises a time interval setting means which sets said specified time interval in said divider ratio compensation means.

5. An electro-optic sampling oscilloscope according to claim 2, which further comprises a trigger signal frequency divider which divides said trigger signal by a second divider ratio and outputs the result as a second trigger signal, and wherein said frequency measurement circuit generates the gate signal having a second pulse width equal the predetermined pulse width multiplied the second divider ratio, and counts pulses of said second trigger signal during one pulse interval of said gate signal.

6. An electro-optic sampling oscilloscope according to claim 1, wherein the monitoring circuit further comprises a divider ratio determination means, and outputs the changed divider ratio as a final divider ratio when the divider ratio continues for a specified time interval, wherein the first divider divides the trigger signal by the final divider ratio and outputs the result as the timing signal.

7. An electro-optic sampling oscilloscope according to claim 6, which further comprises a trigger signal frequency divider which divides said trigger signal by a second divider ratio and outputs the result as a second trigger signal, and wherein said frequency measurement circuit generates the gate signal having a second pulse width equal the predetermined pulse width multiplied the second divider ratio, and counts pulses of said second trigger signal during one pulse interval of said gate signal.

8. An electro-optics sampling oscilloscope according to claim 6, wherein said monitoring circuit further comprises a time interval setting means which sets said specified time interval in said divider ratio compensation means.

9. An electro-optic sampling oscilloscope according to claim 1, which further comprises a trigger signal frequency divider which divides said trigger signal by a second divider ratio and output the result as a second trigger signal, and wherein said frequency measurement circuit generates the gate signal having a second pulse width equal the predetermined pulse width multiplied the second divider ratio, and counts pulses of said second trigger signal during one pulse interval of said gate signal.

* * * * *